United States Patent [19]
Morisson et al.

[11] Patent Number: 5,805,096
[45] Date of Patent: Sep. 8, 1998

[54] A/D CONVERTER WITH INTERPOLATION

[75] Inventors: Richard Morisson, Caen, France; Pieter Vorenkamp, Eindhoven, Netherlands

[73] Assignee: U.S. Philips Corporation, New York, N.Y.

[21] Appl. No.: 764,834

[22] Filed: Dec. 12, 1996

Related U.S. Application Data

[63] Continuation-in-part of Ser. No. 657,475, May 29, 1996.

[30] Foreign Application Priority Data

May 31, 1995 [FR] France ................... 95 06478

[51] Int. Cl.$^6$ ................................................. H03M 1/14
[52] U.S. Cl. ........................................ 341/155; 341/159
[58] Field of Search .............................. 341/155, 156, 341/159, 161; 364/724.1

[56] References Cited

U.S. PATENT DOCUMENTS

| | | | |
|---|---|---|---|
| 4,430,736 | 2/1984 | Scholz | 371/31 |
| 4,831,379 | 5/1989 | van de Plassche | 341/156 |
| 5,497,155 | 3/1996 | Izuhara | 341/156 |

*Primary Examiner*—Howard L. Williams
*Assistant Examiner*—Peguy Jean Pierre
*Attorney, Agent, or Firm*—Steven R. Biren

[57] ABSTRACT

An A/D converter in which an interpolation circuit (15, 16, 17, 18) makes weighted combinations of reference crossing signals (A/Ac,B/Bc) provided by an input circuit (100, 200), so as to obtain an expanded set of reference crossing signals (A/Ac+A1/Ac1 . . . A7/Ac7, B/Bc+B1/Bc1 . . . Bc7). The interpolation circuit (15, 16, 17, 18) is arranged to make at least one weighted combination of reference crossing signals with weighting factors which have a non-integer ratio so as to compensate for a non-linearity in the reference crossing signals (A/Ac,B/Bc). Accordingly, a better compromise is obtained between accuracy, on the one hand, and circuit complexity, on the other hand.

6 Claims, 7 Drawing Sheets

A/D CONVERTER WITH INTERPOLATION

This is a continuation-in-part of application Ser. No. 08/657,475, filed May 29, 1996.

BACKGROUND OF THE INVENTION

The invention relates to an A/D converter in which a set of reference crossing signals is expanded by means of interpolation. The invention also relates to an interpolation circuit and method.

U.S. Pat. No. 4,831,379 describes an 8-bit prior art A/D converter of the above identified type. The prior art A/D converter, shown in FIG. 3 of U.S. Pat. No. 4,831,379 comprises the following parts: an array of 64 input amplifiers, a folding array, an interpolation circuit, fine and coarse comparators, and an encoder.

In the array of 64 input amplifiers A0–A63, each amplifier Ai amplifies the difference between an analog input voltage Vi and a distinct reference voltage VRi. The folding array combines the 64 output signals VA0–VA63 of the array of 64 input amplifiers into a set of 8 main signals VB0–VB7, which will further be referred to as reference crossing signals. The set of 8 reference crossing signals VB0–VB7 comprises a total of 64 reference crossings. That is, when the analog input signal value monotonously changes from one extreme to the other extreme, each reference crossing signal VB0–VB7 will 8 times cross a reference value V0. Each reference crossing occurs at a distinct analog input signal value which corresponds to a reference voltage VR0–VR63 as illustrated in FIGS. 5 and 7 of U.S. Pat. No. 4,831,379.

The reference crossing signals VB0–VB7 are applied to input nodes N0, N4, . . . N28 of a string of resistors which constitute the interpolation circuit, shown in FIG. 8 of U.S. Pat. No. 4,831,379. Four resistors, which all have the same resistance value RI, lie between each pair of consecutive input nodes. The three nodes in between each pair of consecutive input nodes are interpolation nodes which provide interpolated reference crossing signals. Accordingly, the interpolation circuit expands the set of 8 reference crossing signals VB0–VB7 by a factor 4, to obtain an expanded set of 32 reference crossing signals VD0–VD31. The interpolation circuit effectively inserts 3 interpolated reference crossings between each pair of consecutive reference crossings obtained from the input circuit, which is illustrated in FIG. 9 of U.S. Pat. No. 4,831,379.

The fine comparators, together with the encoder, derive 5 least significant output bits MSB-3 . . . MSB-7 from the expanded set of 32 reference crossing signals VD0–VD32. The value of these output bits, i.e. whether a certain output bit is a logical "1" or "0", depends on between which reference crossings the analog input signal value lies. The interpolated reference crossings provided by the interpolation circuit, allow a finer digital conversion than that possible with the reference crossings obtained solely from the input circuit.

SUMMARY OF THE INVENTION

The invention seeks to provide an A/D converter which, which respect to the prior art A/D converter, allows a better compromise between accuracy, on the one hand, and circuit complexity, on the other hand. According to a first aspect of the invention, there is provided an A/D converter as defined in claim 1. According to another aspect of the invention, there is provided an interpolation circuit as defined in claim 5. According to yet another aspect of the invention, there is provided a method of interpolation as defined in claim 6. Advantageous embodiments are defined by the dependent claims.

The invention takes the following aspects into consideration. In principle, a satisfactory compromise between accuracy, on the one hand, and circuit complexity, on the other hand, may be obtained by choosing a suitably high interpolation factor. This can be explained by reference to the prior art A/D converter. The expanded set of 32 reference crossing signals, each comprising 8 reference crossings, has a total of 256 reference crossings. The total of 256 reference crossings limit the accuracy to 8-bit. Each of the 64 input amplifiers provides one reference crossing, the remaining 192 are obtained by means of interpolation. The interpolation circuit effectively simulates a number of 192 input amplifiers which would additionally be needed, if no interpolation were used. If, however, the interpolation factor were 16, instead of 4, only 16 input amplifiers would be needed to obtain the total of 256 reference crossings. Or, if the interpolation factor were 16, a total of 1024 reference crossings would be obtained with the 64 input amplifiers.

In principle, the interpolation factor of the prior art A/D converter could be increased from 4 to 16, for example, by coupling 16 instead of 4 resistors of equal resistance between input nodes to which reference crossing signals from the folding array are applied. However, due to the non-linearity of the reference crossing signals applied to the interpolation circuit, the interpolated reference crossings would be substantially dislocated if the interpolation factor were increased in that manner. Accordingly, the A/D conversion accuracy would be significantly less than the limit defined the total number of reference crossings in the expanded set of reference crossing signals. In that sense, the interpolation factor of the prior art A/D converter is limited and, consequently, the compromise between accuracy, on the one hand, and circuit complexity, on the other hand is limited too.

In accordance with the invention, the interpolation circuit is arranged to make at least one weighted combination of reference crossing signals supplied thereto, with weighting factors which have a non-integer ratio so as to compensate for a non-linearity in the reference crossing signals. This is in contrast with the prior art A/D converter, in which weighting factors have an integer ratio for each weighted combination, since the resistors in the string of resistors have equal resistances. Because, in accordance with the invention, the non-linearity of the reference crossing signals is compensated with weighting factors which have a non-integer ratio, the interpolated reference crossings will be substantially equidistantly located between the reference crossing applied to the interpolation circuit. Accordingly, an accuracy may be obtained which is close to the limit defined by the total number of reference crossings obtained by interpolation.

The invention thus permits a reduction of the total number of input amplifiers, thus considerably reducing the surface taken up by the converter on the semiconductor crystal. Besides, the power consumption of the converter is also diminished thereby, which makes is particularly suitable for use in portable devices such as camcorders, cellular telephones and others. In addition, the invention also permits a more precise conversion of the analog input signal, because the interpolation errors resulting from a non-linearity of the reference crossing signals are compensated for, which makes it possible to obtain a sampling scale of improved linearity.

In an embodiment of the invention, the interpolation circuit comprises a string of impedance elements which have nominal values defined for compensating for a non-linearity of the reference crossing signals supplied thereto.

The invention and additional features, which may optionally be used to implement the invention to advantage, will be apparent from and elucidated with reference to the examples described hereafter.

DESCRIPTION OF THE PREFERRED EMBODIMENTS

Figure 1:
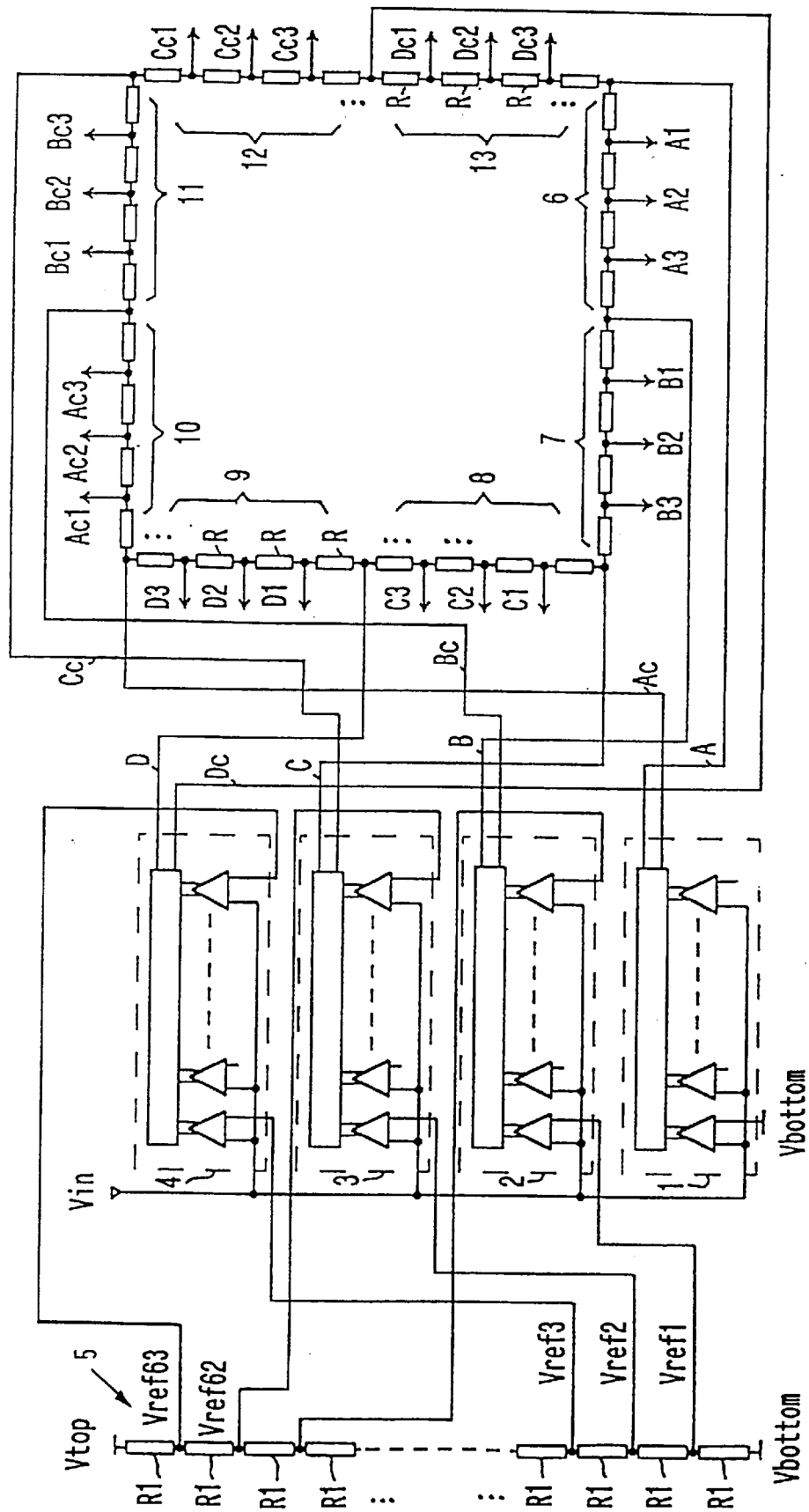
FIG. 1 is a functional diagram describing an example of a known analog/digital converter which utilizes the folding and interpolation techniques.

FIG. 1 shows a partial functional diagram of a known analog/digital converter which utilizes folding and interpolation techniques, of which the digital output signal is coded in 8 bits, for example. Such an analog/digital converter comprises four folding stages 1, 2, 3 and 4 which include each sixteen comparators. Each of these comparators makes a comparison between an analog input signal Vin and a reference voltage denoted $Vref_i$, i varying from 0 to 63. These reference voltages are generated at the interpolation nodes of a voltage divider bridge 5 which comprises 64 impedance elements with equal nominal values, preferably resistors. Vtop and Vbottom are the supply voltages of the divider bridge, and define the maximum peak-to-peak amplitude $\Delta Vin_{max}$ of the analog input signal Vin by: $\Delta Vin_{max} = Vtop - Vbottom$.

The reference voltages are distributed in a particular way which will be explained in the following: the voltage $Vref_{(j-1)+4.(k-1)}$ is connected to the reference voltage input of the $k^{th}$ comparator of the $j^{th}$ folding stage (k varies from 1 to 16 and j from 1 to 4, and $Vref_0 = Vbottom$).

In a same folding stage, the $k^{th}$ comparator delivers two complementary output signals denoted $S_k$ and $Sc_k$. The superposition of the signals $S_1$, $Sc_2$, $S_3$, $Sc_4$, $S_5$ and so on, up to $Sc_{13}$, $S_{14}$, $Sc_{15}$ forms a signal evolving in a quasi sinusoidal way as a function of Vin. The signal is a reference crossing signal which comprises more than one reference crossing. Such reference crossing signals will further be referred to as folding signals. A complementary folding signal is obtained by superimposing in the previously described manner the comparator output signals which are complementary to those cited above.

The folding stage 1 thus produces the folding signals A and Ac, the folding stage 2 produces the folding signals B and Bc, the folding stage 3 produces the folding signals C and Cc, the folding stage 4 produces the folding signals D and Dc.

Figure 2:
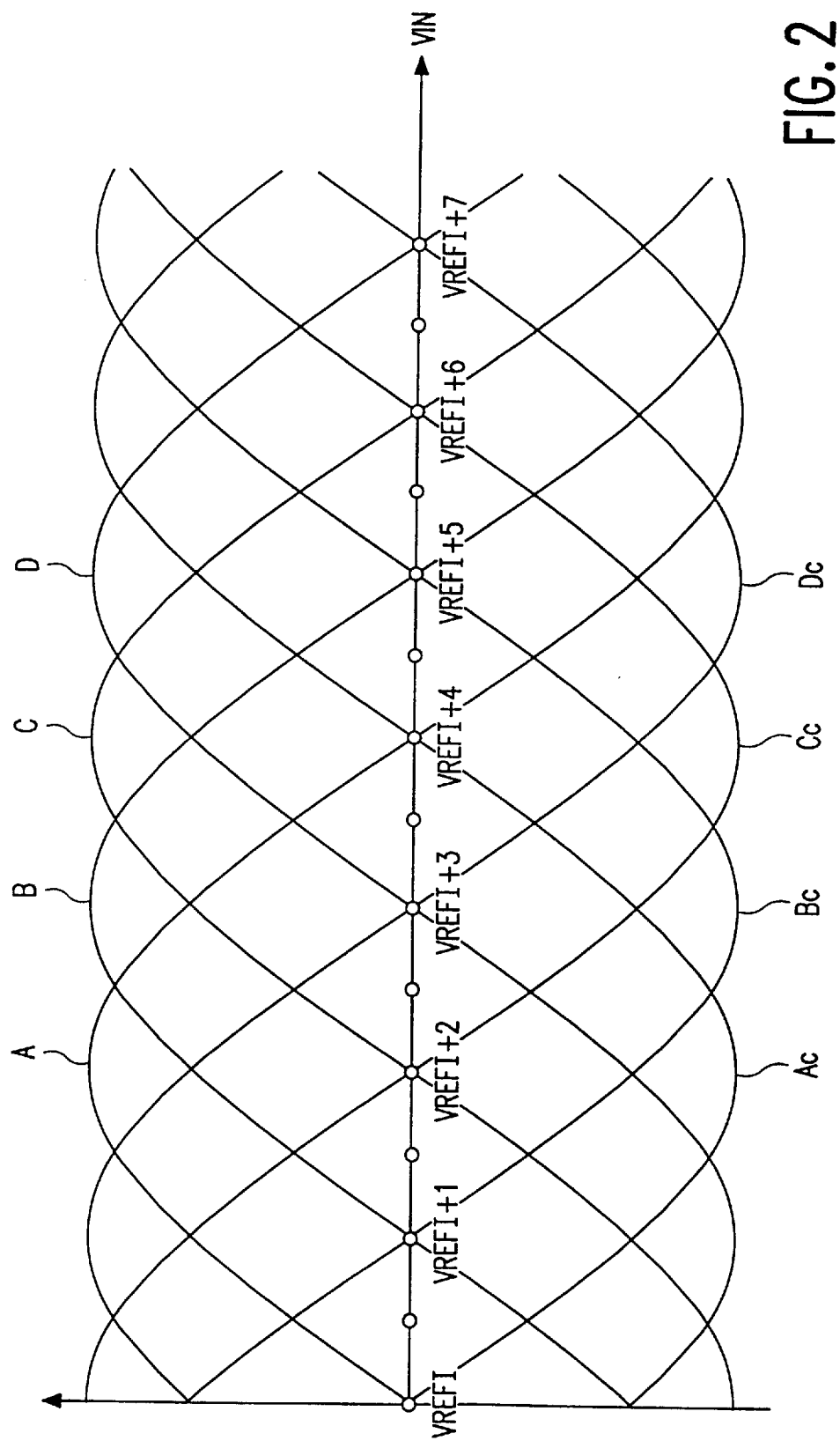
FIG. 2 is a graph which shows a transfer characteristic representing the folding signals of an embodiment of a known analog/digital converter which utilizes the folding and interpolation techniques.

These signals are shown in FIG. 2. Their regular overlap is due to the above-described choice of the distribution of the reference voltages. Their reference crossing, detected when a folding signal and its complementary signal cross each other, is stored and represents the value of the analog input voltage Vin. The reference crossings, represented by small circles on the axis Vin of FIG. 2 thus form a sampling scale of the voltage Vin, which scale is linear because of the linearity of the distribution of the reference voltages.

The interpolation technique intends to create by simple means folding signals in between the folding signals described previously, to obtain significant additional reference crossings, and thus enhance the resolution of the conversion.

An interpolation stage is arranged in the form of a divider bridge constituted by n impedance elements of equal nominal values, preferably resistors, connected in series. The number n is called interpolation factor. It partly defines the precision of the conversion. If N is the number of bits in which the output signal is to be coded after its binary conversion, $n_c$ the number of comparators in a single folding stage and $n_r$ the number of folding stages, the relation $2^N = n.n_c.n_r$ defines the interpolation factor as a function of the physical parameters due to the circuit architecture. In the example of the analog/digital converter shown in diagrammatic form in FIG. 1, n has been chosen to be equal to 4.

Figure 3:
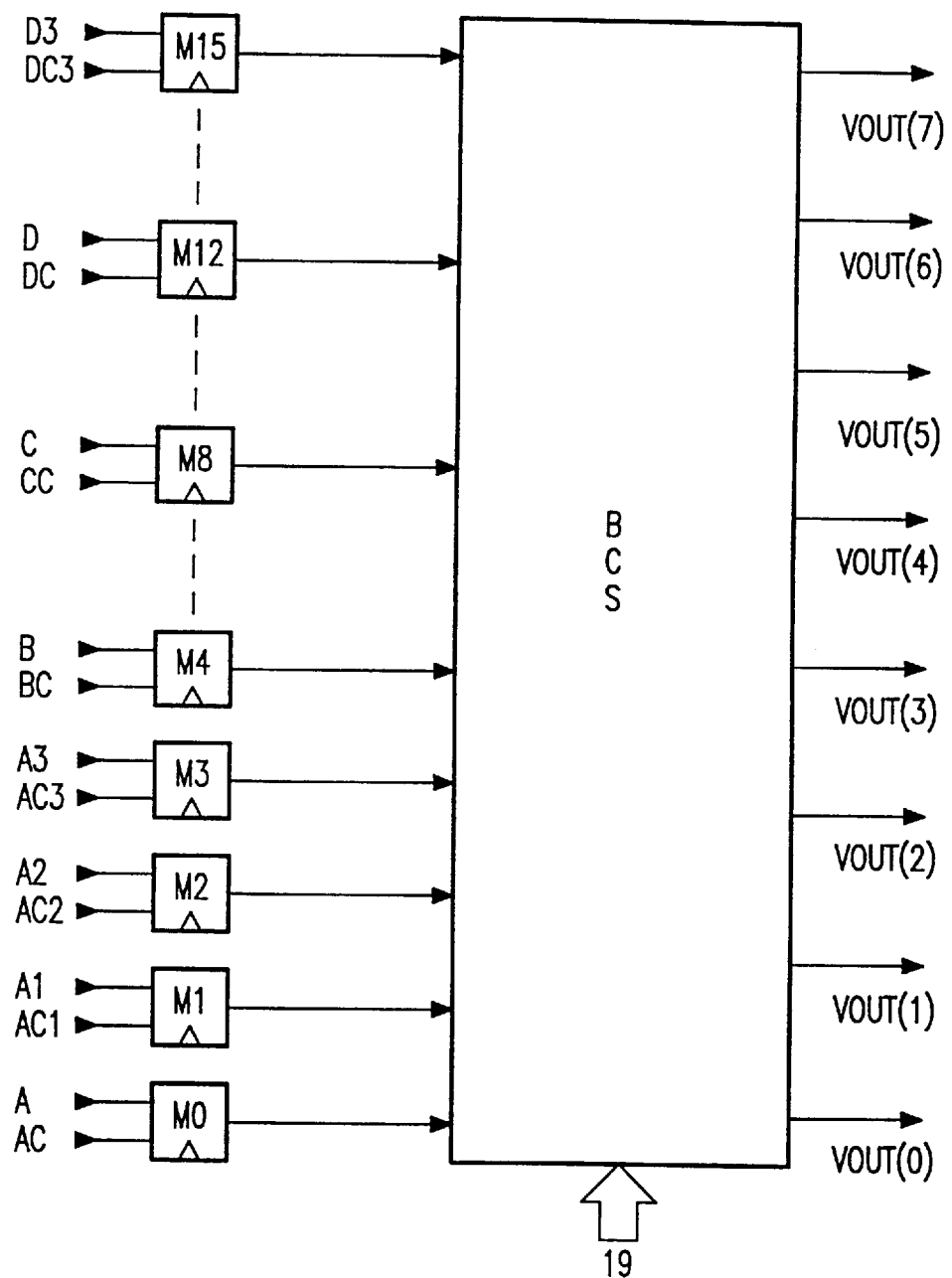
FIG. 3 is a functional diagram partly describing the digital part of an embodiment of a known analog/digital converter which utilizes the folding and interpolation techniques.

As shown in FIG. 1, the interpolation stages 6, 7, 8, 9, 10, 11, 12 and 13 are fed by the respective signals A and B, B and C, C and D, D and Ac, Ac and Bc, Bc and Cc, Cc and Dc, Dc and A. They generate the respective interpolation signals $A_1$, $A_2$, $A_3$, $B_1$, $B_2$ ... $D_2$, $D_3$, $Ac_1$, $Ac_2$, $Ac_3$, $Bc_1$, $Bc_2$, ... $Dc_2$, $Dc_3$. The signals $A_i$ and $Ac_i$, $B_i$ and $Bc_i$, $C_i$ and $Cc_i$, $D_i$ and $Dc_i$ are mutually complementary. The reference crossing of a signal, for example $A_1$, represented by a small circle on the axis Vin of FIG. 2, is detected when the latter and its complementary signal, that is $Ac_1$, cross each other. This reference crossing is stored in the digital part, as is shown in a diagram in FIG. 3, in a bank of memory flip-flops M0, M1 ... M15 of which the contents are coded in 8 bits by a binary coding system BCS as a function of a pointer which indicates the period of the quasi sine curve in which the reference crossing is situated, of which pointer only the outputs 19 are shown at the input of the binary coding system BCS, and thus produces a conversion result Vout(0) ... Vout(7).

The overlap rate is to be higher than or equal to 4, as is the case in this example, that is to say, sufficiently large for the reference crossings of the interpolation signals to take place in a quasi linear evolution zone of the folding signals which have produced the interpolation signals. Because of the linearity of the interpolation, which is the result of the equality of the nominal values of the impedance elements forming the interpolation stages, the sampling scale may be considered linear.

The interpolation factor partly defines the precision of the conversion. If N is the number of bits in which the output signal is to be coded after its binary conversion, $n_c$ is the number of comparators included in a single folding stage and $n_r$ is the number of folding stages, the relation $2^N = n.n_c.n_r$ defines the interpolation factor as a function of the physical parameters resulting from the architecture of the circuit. Consequently, when the number of folding stages is reduced by a factor of 2, it is necessary to double the interpolation factor and thus the number of impedance elements forming one interpolation stage in order to have the same degree of precision, which is not unfavorable because the number of signals to be interpolated has been reduced by half. The total number of impedance elements forming the ensemble of the interpolation stages thus remains unchanged.

An embodiment of the invention will now be described in which, as stated above, the conversion of an analog input signal into 8 bits will be considered.

Figure 4:
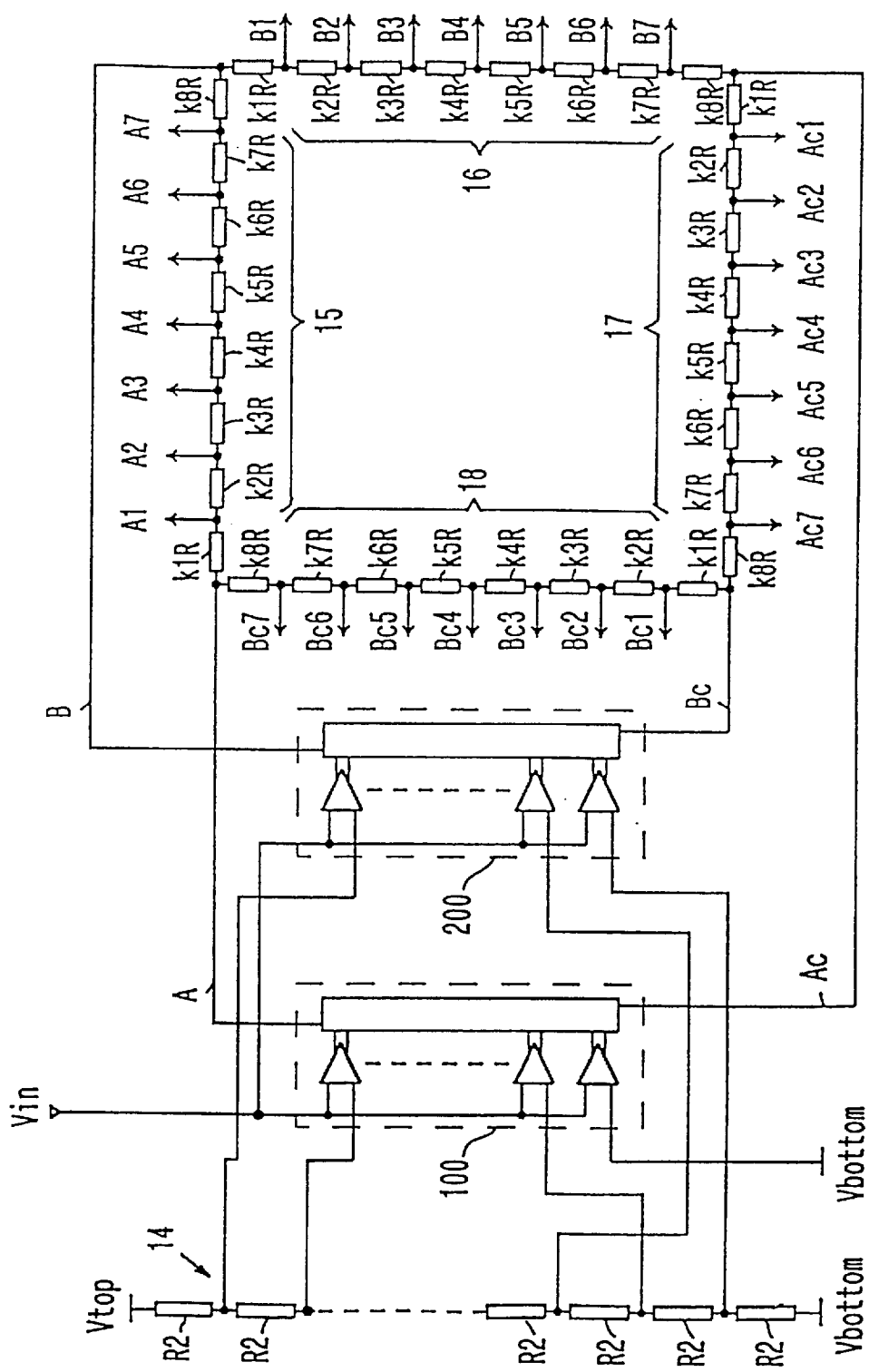
FIG. 4 is a functional diagram describing an embodiment of an analog/digital converter according to the invention.

FIG. 4 shows a partial functional diagram of an analog/digital converter which utilizes the folding and interpolation techniques according to the invention, of which the digital output signal is coded in 8 bits, for example. Such an analog/digital converter comprises two folding stages 100 and 200 including sixteen comparators each. Each of these comparators makes a comparison between an analog input signal Vin and reference voltages denoted $Vref_i$, i varying from 0 to 31. These reference voltages are generated at the interpolation nodes of a voltage divider bridge 14 which comprises 32 impedance elements of equal nominal values, preferably resistors. Vtop and Vbottom are supply voltages of the divider bridge, again defining the maximum peak-to-peak amplitude $\Delta Vin_{max}$ of the analog input signal Vin via: $\Delta Vin_{max}$=Vtop−Vbottom.

The reference voltages are distributed in a particular way: in stage 100 the comparators successively receive all the reference voltages having an even index $Vref_{2p}$, ($Vref_0$=Vbottom), whereas in stage 200 the comparators successively receive all the reference voltages having an odd index $Vref_{2p+1}$.

In a like folding stage, the $k^{th}$ comparator produces two complementary output signals denoted $S_k$ and $Sc_k$. The superposition of the signals $S_1$, $Sc_2$, $S_3$, $Sc_4$, $S_5$ and so on up to $Sc_{13}$, $S_{14}$, $Sc_{15}$ forms a signal evolving in a quasi sinusoidal manner as a function of Vin. This signal is called folding signal and its complementary signal is obtained by superimposing in the manner described previously the comparator output signals which are complementary to those that have been cited above.

Figure 5:
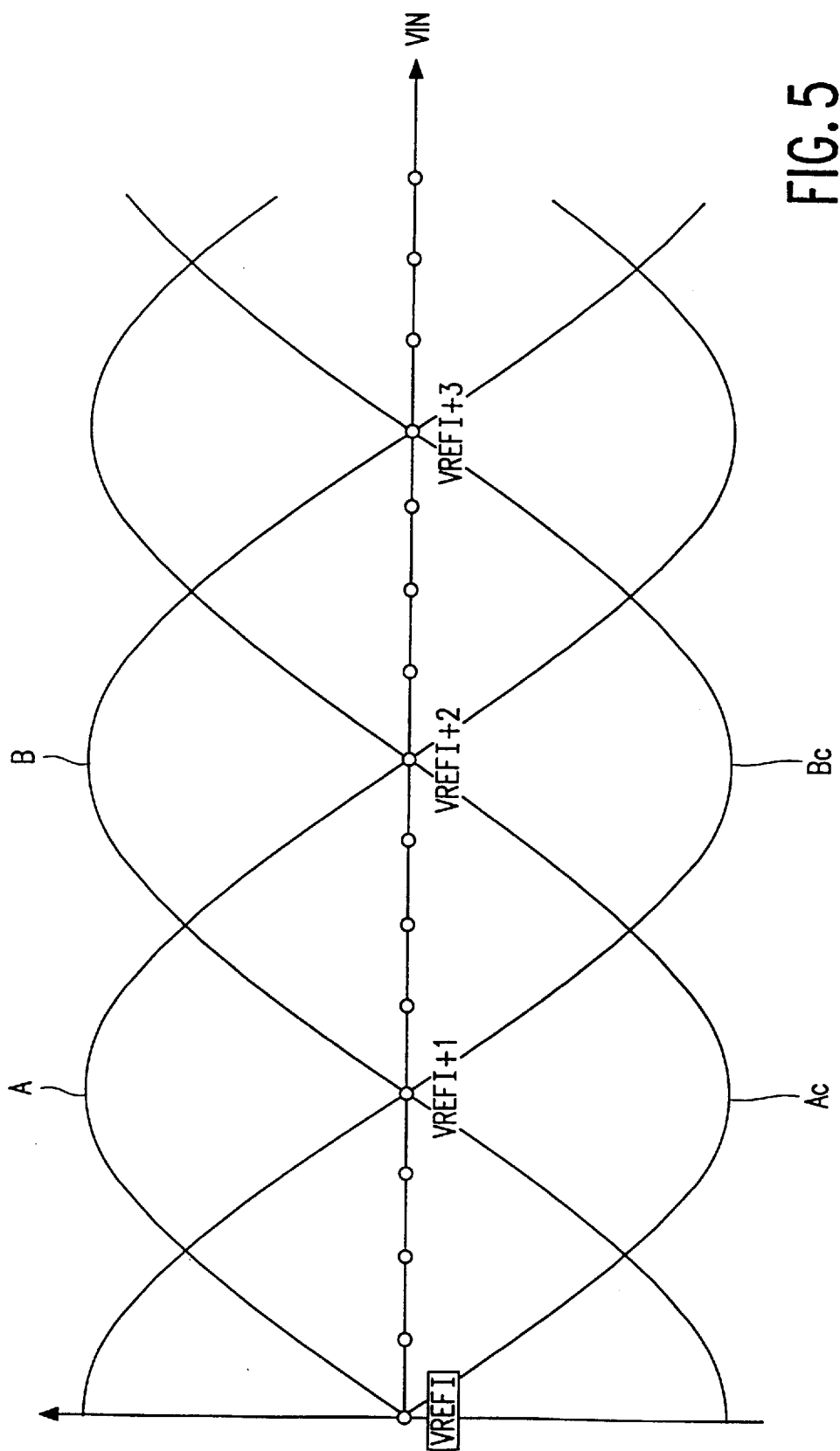
FIG. 5 is a graph which shows a transfer characteristic representing the evolution of the folding signals of an embodiment of the converter according to the invention.

The folding stage 100 thus produces the folding signals A and Ac and the folding stage 200 produces the folding signals B and Bc. These signals are shown in FIG. 5.

The analog/digital converter according to the invention is characterized in that those of the impedance elements that form the interpolation stages have nominal values defined to compensate for a non-linearity of the folding signals. Thus, the reference crossings, shown by small circles on the axis Vin of FIG. 5, of the interpolation signals generated by the folding signals in zones where they do not evolve linearly, form a linear scale.

An interpolation stage of an analog/digital converter according to the invention is embodied in the form of a divider bridge constituted by n impedance elements, preferably resistors, connected in series. The number n is still governed by the relation $2^N$=n.$n_c$. $n_r$. Consequently, when reducing the number of folding stages by a factor of 2, it is necessary to double the interpolation factor and thus the number of impedance elements forming the interpolation stages in order to have a like degree of precision, which is not unfavorable because the number of signals to be interpolated has been reduced by half. The total number of impedance elements forming the whole of the interpolation stages thus remains unchanged.

Each of the impedance elements forming one interpolation stage has a value R that corresponds to the common value said impedance elements would have had in the case of a linear interpolation, multiplied by an interpolation weight factor which depends on the position of each of those impedance elements, which value will be expressed by $R_i$=$k_i$. R, $R_i$ being the value the $i^{th}$ impedance element relative to a node at which a folding signal arrives and $k_i$ being its associated interpolation factor defined by the two following relations:

$$\frac{k_{i+1} + \ldots + k_n}{k_1 + \ldots + k_i} = \frac{th[((n-i)/n) \cdot (\Delta Vref/2 \cdot Vt)]}{th[(i/n) \cdot (\Delta Vref/2 \cdot Vt)]}$$

for i=1 to n/2, and $k_{i+1}$=$k_{n-i}$ for i=n/2 to n−1, where $\Delta Vref$ represents the difference between two successive reference voltages to which is compared the analog input voltage Vin, Vt=k.T/q, k being the Boltzmann constant, T the absolute temperature and q the charge of the electron.

In the particular case of an interpolation factor n=8, one thus indicates:

$k_1$=1, $k_2$=0.854, $k_3$=0.759, $k_4$=0.716, $k_8$=$k_1$, $k_7$=$k_2$, $k_6$=$k_3$, $k_5$=$k_4$ in conformity with the above relations.

Figure 6:
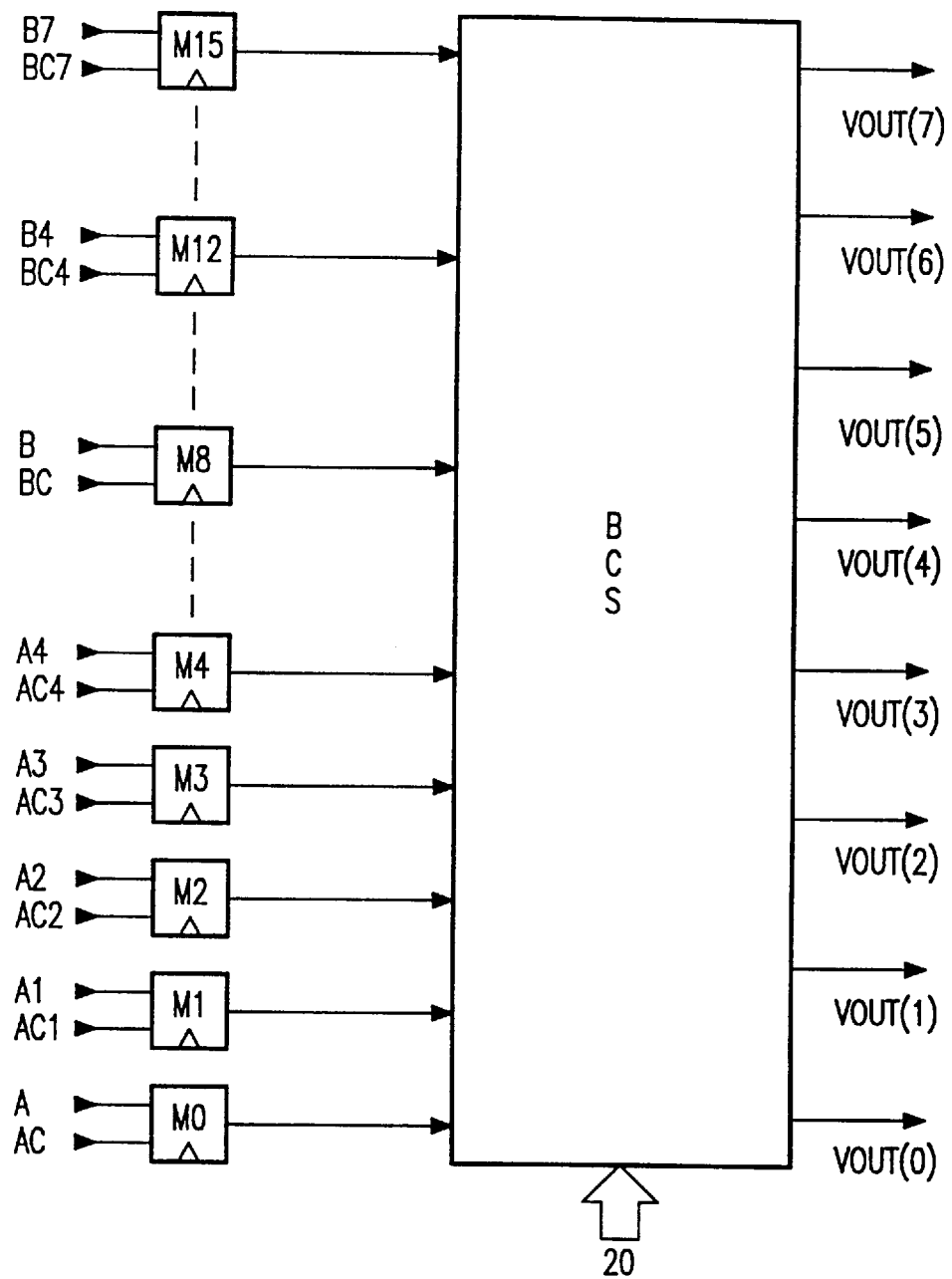
FIG. 6 is a functional diagram partly describing the digital part of an embodiment of an analog/digital converter according to the invention.

The interpolation stages 15, 16, 17 and 18 are fed respectively, by A and B, B and Ac, Ac and Bc, Bc and A. They generate the respective interpolation signals $A_1$, $A_2$, . . . $A_7$, $B_1$, $B_2$, . . . $B_7$, $Ac_1$, $Ac_2$, . . . $Ac_7$, $Bc_1$, $Bc_2$, . . . $Bc_7$. The signals $A_i$ and $Ac_i$, $B_i$ and $Bc_i$ are each other's complements. The reference crossing of a signal, for example $A_1$, is detected when this signal and its complementary signal, that is $Ac_1$, cross each other. This reference crossing is stored in the digital part, as is shown diagrammatically in FIG. 6, in a bank of memory flip-flops M0, M1, . . . M15 whose contents are coded in 8 bits, by a binary coding system BCS as a function of a pointer indicating the period of the quasi sine curve in which the reference crossing is situated, of which pointer only the outputs 20 are shown at the input of the binary coding system BCS, and thus produces a more precise conversion result Vout=(0) . . . Vout(7), because all the non-linear effects have been compensated for.

There are many advantages of such an analog/digital converter: first of all, the number of comparators included in the circuit is almost reduced by half, which permits of the reduction of the required surface of silicon, all the more because this reduction of the number of comparators again brings the arrangement on the surface into balance, notably with respect to the memory flip-flops, thus improving the form factor of the circuit. The reduction of the number of comparators also considerably reduces the power consumption of the converter. This reduction by more than a factor of 2 makes it possible for an analog/digital converter according to the invention to be used in the "low voltage" applications, and notably in portable devices such as camcorders, cellular telephones and others.

The power consumption of the circuit which was about 300 mW in the case of the known converter described above is thus reduced to about 25 mW.

Figure 7B:
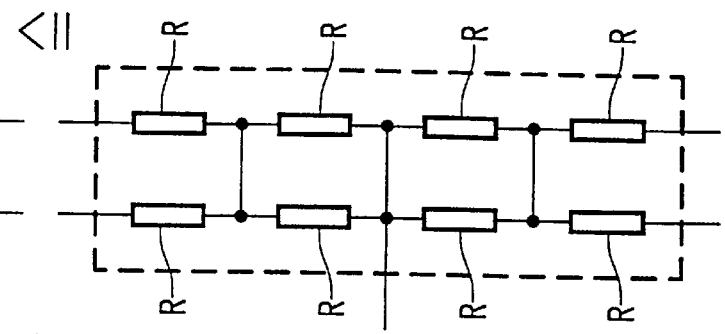
FIG. 7b shows, in a circuit diagram form, the internal structure of resistor module RMi in the FIG. 7a A/D converter.
Figure 7A:
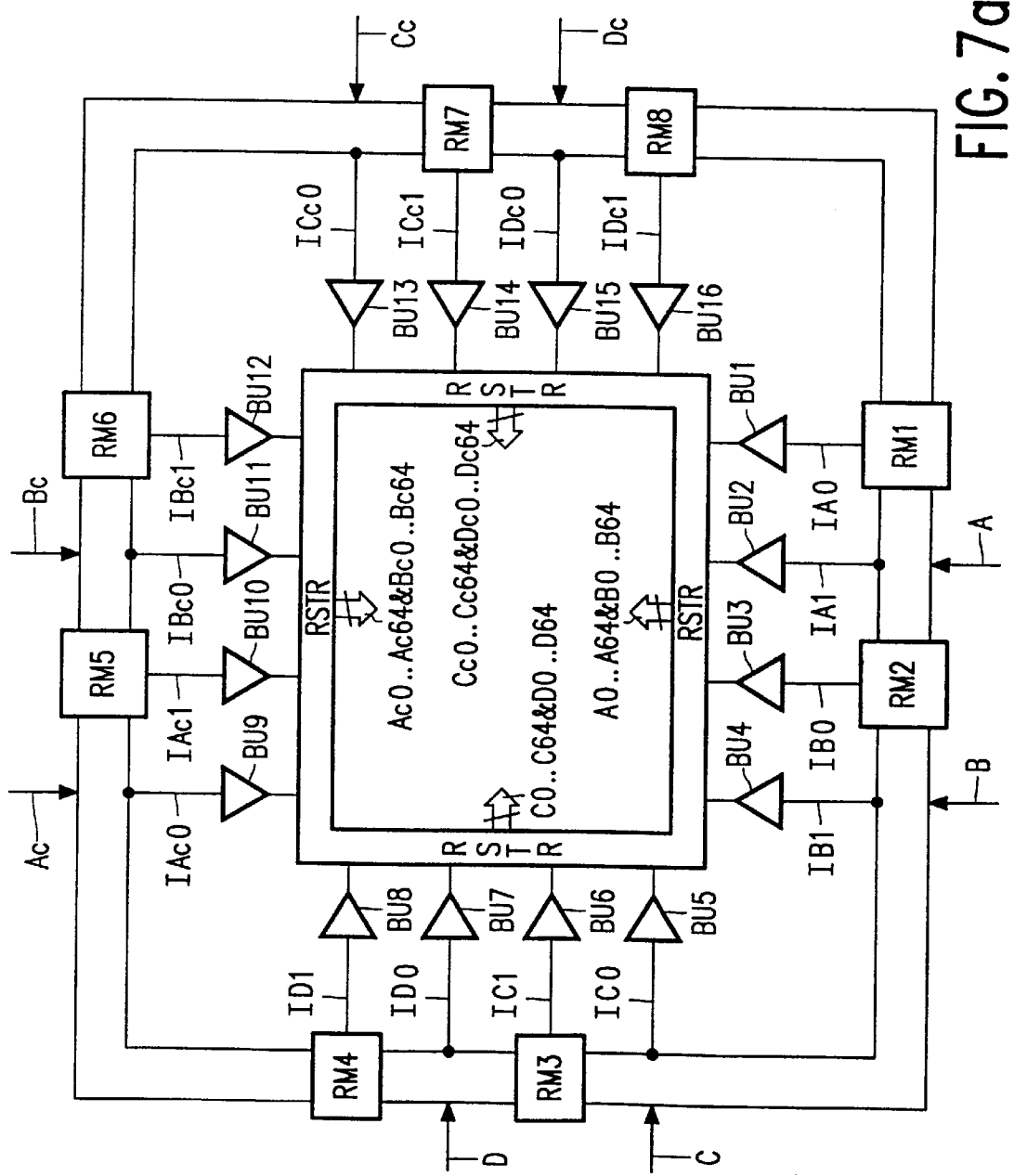
FIG. 7a shows, in a block diagram form, an interpolation circuit in accordance with the invention which may be used in the FIG. 1 A/D converter.

FIG. 7a shows an interpolation circuit which, for example, may be used in the FIG. 1 A/D converter. The FIG. 7a interpolation circuit provides, in response to the set of 4 reference crossing signal pairs A/Ac . . . D/Dc, which are indicated in FIG. 1, an expanded set of 256 reference crossing signal pairs A0Ac0 . . . A64/Ac64, B0/Bc0 . . . B64/Bc64, C0/Cc0 . . . C64/Cc64, D0/Dc0 . . . D64/Dc64. Thus, the FIG. 7a interpolation circuit has an interpolation factor of 64. The expanded set of reference crossing signals may be supplied to a digital part having a structure similar to that of the FIG. 3 digital part, but comprising an array of 256 memory flip-flop: one memory flip-flop for each pair of reference crossing signals in the expanded set of 256 reference crossing signals.

The FIG. 7a interpolation circuit may be divided into two interpolation sub-circuits formed by an array of resistor modules RM1 . . . RM8 and a resistor string RSTR, respectively. The array of resistor modules RM1 . . . RM8 effects a first interpolation of a factor 2 and the resistor string RSTR effects a second interpolation of a factor 32. The array of resistor modules RM1 . . . RM8 receives the set of 4 reference crossing signals pairs A/Ac . . . D/Dc and provides, in response, a set of 8 intermediate signal pairs IA0/IAc0, IA1/IAc1, IB0/IBc0, IB1/IBc1, IC0/ICc0, IC1/ICc1, ID0/IDc0, ID1/IDc1. This set of 8 intermediate signal pairs is supplied to the resistor string RSTR via an array of 16 buffer amplifiers BU1 . . . BU16. The resistor string RSTR provides, in response to the set of 8 intermediate signal pairs, the expanded set of 256 reference crossing signals.

The internal structure of the resistor modules RM1 . . . RM8 is shown in 7b. Each resistor module comprises 8 resistors of equal resistance R. The 8 resistors are arranged in two parallel strings of 4 resistors. The intermediate nodes of both strings are mutually coupled. It should be noted that the mutual coupling of the nodes in middle of the strings, may be dispensed with. The FIG. 7b resistor module structure makes that the intermediate signals pairs, which are supplied to the resistor string RSTR, have substantially equal peak-peak values. Because of this, the reference crossings will be substantially equidistant if the intermediate signal pairs are further be interpolated in a conventional manner.

The resistor string RSTR may be of conventional structure. That is, the resistor string RSTR may comprise a string of 512 resistors of equal resistance, the extreme of the strings being connected so as to form a ring of 512 resistors with 512 nodes. An intermediate signal, which is provided by the array resistor modules RM1 . . . RM8, is applied to each 64th node in the resistor string RSTR.

The FIG. 7a interpolation circuit and the interpolation circuit in the FIG. 4 A/D converter have the following in common. Both interpolation circuits make weighted combinations of reference crossing signals provided an input circuit, so as to obtain an expanded set of reference crossing signals. Both interpolation circuits are arranged to make at least one weighted combination of reference crossing signals with weighting factors which have a non-integer ratio so as to compensate for a non-linearity in the reference crossing signals. This allows a better compromise to be made between accuracy, on the one hand, and circuit complexity, on the other hand. For example, the FIG. 4 A/D converter according to the invention has less input circuitry than the prior art A/D converter shown in FIG. 1, but has a comparable accuracy. An other example, if the input circuitry of the FIG. 1 prior art A/D converter is used together with the FIG. 7a interpolation circuit, an A/D converter which has a significantly higher resolution will be obtained.

It should be noted that the use of folding techniques is not essential to the invention. The invention may, for example, also be used to advantage in A/D converters in which the output signals of input amplifiers are interpolated, without these output signals being folded first. What matters is that there is a set of reference crossings, provided by input amplifiers, which set of reference crossings is expanded an interpolation circuit. The interpolation circuit may receive reference crossing signals which have one reference crossing only, or it may receive reference crossing signals which comprise a plurality of reference crossings due to folding.

What is claimed is:

1. An A/D converter comprising:

an input circuit (100, 200) to obtain, in response to an A/D converter input signal (Vin), a set of reference crossing signals (A/Ac,B/Bc);

an interpolation circuit (15, 16, 17, 18) for making weighted combinations of reference crossing signals provided by the input circuit, so as to obtain an expanded set of reference crossing signals (A/Ac+A1/Ac1 . . . A7/Ac7,B/Bc+B1/Bc1 . . . B7/Bc7); and an output circuit (M0 . . . M15, BCS) to obtain an A/D converter output signal (VOUT0 . . . VOUT7) on the basis of the expanded set of reference crossing signals provided by the interpolation circuit, characterized in that the interpolation circuit (15, 16, 17, 18) comprises a network of strings of series-connected impedance elements and is arranged to make at least one weighted combination of reference crossing signals with weighting factors which have a non-integer ratio.

2. An A/D converter as claimed in claim 1, in which the interpolation circuit comprises:

a first interpolation sub-circuit (RM1 . . . RM8) for effecting a first interpolation between the reference crossing signals (A/Ac . . . D/Dc) provided by the input circuit, to obtain intermediate signals (IA0/IAc0, IA1/IAc1, IB0/IBc0, IB1/IBc1, IC0/ICc0, IC1/ICc1, ID0/IDc0, ID1/IDc1) which have substantially equal amplitudes; and a second interpolation sub-circuit (RSTR) for effecting a second interpolation between the intermediate signals, to obtain interpolated reference crossing signals in the expanded set of reference crossing signals.

3. An A/D converter as claimed in claim 1, in which the interpolation circuit is formed by strings of series-connected impedance elements which do not all have the same value so as to compensate for a non-linearity of the folding signals.

4. An A/D converter as claimed in claim 3, characterized in that each of the n impedance elements which form the interpolation circuit, n being the interpolation factor and being equal to a power of 2 higher than or equal to 4, has a value R that corresponds to the common value said impedance elements would have had in the case of a linear interpolation, multiplied by an interpolation weight factor which depends on the position of each of those impedance elements, which value is expressed by $R_i=k_i.R$, $R_i$ being the value of the $i^{th}$ impedance element relative to a node at which a reference crossing signal arrives and $k_i$ being its associated interpolation coefficient defined by the two following relations:

$$\frac{k_{i+1} + \ldots + k_n}{k_1 + \ldots + k_i} = \frac{th[((n-i)/n) \cdot (\Delta Vref/2 \cdot Vt)]}{th[(i/n) \cdot (\Delta Vref/2 \cdot Vt)]}$$

for i=1 to n/2, and $k_{i+1}=k_{n-i}$ for i=n/2 to n−1, where ΔVref represents the difference between two successive reference voltages to which the analog input voltage is compared, $Vt=k.T/q$, k being the Boltzmann constant, T the absolute temperature and q the charge of the electron.

5. Interpolation circuit (15, 16, 17, 18) for making weighted combinations of reference crossing signals (A/Ac, B/Bc), so as to obtain an expanded set of reference crossing signals (A/Ac+A1/Ac1 ... A7/Ac7,B/Bc+B1/Bc1 ... Bc7), characterized in that the interpolation circuit (15, 16, 17, 18) comprises a network of strings of series-connected impedance elements and is arranged to make at least one weighted combination of reference crossing signals with weighting factors which have a non-integer ratio.

6. Method of interpolation which comprises the step of making weighted combinations of reference crossing signals (A/Ac,B/Bc), so as to obtain an expanded set of reference crossing signals (A/Ac+A1/Ac1 ... A7/Ac7,B/Bc+B1/Bc1 ... Bc7), characterized in that an interpolation circuit is provided which comprises a network of strings of series-connected impedance elements and at least one weighted combination of reference crossing signals is made with weighting factors which have a non-integer ratio.

* * * * *